United States Patent
Ohno

(10) Patent No.: US 9,595,484 B2
(45) Date of Patent: Mar. 14, 2017

(54) POWER CONVERTER

(71) Applicant: Toyota Jidosha Kabushiki Kaisha, Toyota-shi, Aichi-ken (JP)

(72) Inventor: Hirotaka Ohno, Miyoshi (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/055,211

(22) Filed: Feb. 26, 2016

(65) Prior Publication Data
US 2016/0254206 A1 Sep. 1, 2016

(30) Foreign Application Priority Data

Feb. 27, 2015 (JP) ................... 2015-038627

(51) Int. Cl.
| | |
|---|---|
| *H01L 23/367* | (2006.01) |
| *H02M 7/5387* | (2007.01) |
| *H01L 23/31* | (2006.01) |
| *H01L 25/065* | (2006.01) |
| *H01L 25/11* | (2006.01) |
| *H02M 7/00* | (2006.01) |
| *H01L 23/40* | (2006.01) |
| *H01L 23/473* | (2006.01) |

(52) U.S. Cl.
CPC .............. *H01L 23/31* (2013.01); *H01L 23/40* (2013.01); *H01L 23/473* (2013.01); *H01L 25/117* (2013.01); *H02M 7/003* (2013.01); *H01L 23/4012* (2013.01)

(58) Field of Classification Search
CPC ....... H01L 23/31; H01L 23/367; H01L 23/40; H01L 23/4012; H01L 23/473; H01L 25/0657; H01L 25/117; H02M 7/003; H02M 7/5387
See application file for complete search history.

(56) References Cited

U.S. PATENT DOCUMENTS

| | | | | |
|---|---|---|---|---|
| 7,692,923 | B2 * | 4/2010 | Nakamura | ......... H05K 7/20927 165/104.33 |
| 8,644,045 | B2 * | 2/2014 | Hamatani | ............... H02M 1/32 323/351 |
| 2009/0302444 | A1 * | 12/2009 | Ueda | ..................... H01L 21/565 257/675 |
| 2012/0181679 | A1 * | 7/2012 | Kadoguchi | ......... H01L 23/3142 257/676 |

(Continued)

FOREIGN PATENT DOCUMENTS

| | | |
|---|---|---|
| JP | 2013-009501 A | 1/2013 |
| JP | 2013-093343 A | 5/2013 |

*Primary Examiner* — Jue Zhang
(74) *Attorney, Agent, or Firm* — Dinsmore & Shohl LLP

(57) ABSTRACT

In a power converter, a plurality of semiconductor devices and a plurality of cooling plates are stacked. The plurality of semiconductor devices includes a first-first sealed semiconductor device, a second-first sealed semiconductor device, and a plurality of second sealed semiconductor devices. The first-first sealed semiconductor device has a first high potential side terminal, and a first low potential side terminal. The second-first sealed semiconductor device has a second high potential side terminal, and a second low potential side terminal. When viewed along a stacking direction, the first high potential side terminal is disposed to overlap with the second low potential side terminal.

10 Claims, 12 Drawing Sheets

(56) References Cited

U.S. PATENT DOCUMENTS

| | | | |
|---|---|---|---|
| 2012/0262968 A1* | 10/2012 | Nagano | H02M 7/003 363/141 |
| 2013/0094269 A1* | 4/2013 | Maeda | H02M 7/003 363/141 |
| 2013/0154084 A1* | 6/2013 | Kadoguchi | H01L 23/3121 257/717 |
| 2014/0118934 A1 | 5/2014 | Tokuyama et al. | |
| 2015/0049533 A1* | 2/2015 | Nishikimi | H02M 7/003 363/141 |

* cited by examiner

POWER CONVERTER

CROSS-REFERENCE TO RELATED APPLICATION

This application claims priority based on Japanese Patent Application No. 2015-038627, filed on Feb. 27, 2015, the entire contents of which are hereby incorporated by reference into the present disclosure.

TECHNICAL FIELD

The present disclosure relates to a power converter. More specifically, present disclosure discloses a technique relating to a power converter in which semiconductor devices are stacked alternately with cooling plates.

DESCRIPTION OF RELATED ART

A power converter in which semiconductor devices are stacked alternately with cooling plates has been developed, and is disclosed in Japanese Patent Application Publication No. 2013-93343. Hereinafter, Japanese Patent Application Publication No. 2013-93343 is referred to as Patent Literature 1. In the power converter in Patent Literature 1, a semiconductor element configuring an upper arm circuit and a semiconductor element configuring a lower arm circuit are incorporated in one semiconductor device. Specifically, two semiconductor elements (transistors with reflux diodes) are incorporated in one semiconductor device, each of the semiconductor elements having a transistor and a diode connected in parallel with the transistor. The two transistors are connected in series. The two semiconductor elements are sealed with resin. In the power converter in Patent Literature 1, a plurality of semiconductor devices is stacked via cooling plates.

SUMMARY

In the power converter in Patent Literature 1, both the semiconductor element configuring the upper arm circuit and the semiconductor element configuring the lower arm circuit are incorporated in one semiconductor device. A number of semiconductor devices can thus be smaller relative to a number of semiconductor elements required. If such semiconductor devices are used as each of which incorporates only either a semiconductor element configuring an upper arm circuit or a semiconductor element configuring a lower arm circuit, the number of such semiconductor devices will be larger than the number of semiconductor devices each of which incorporates both the semiconductor element configuring the upper arm circuit and the semiconductor element configuring the lower arm circuit. Herein, the semiconductor device which incorporates one set of "one transistor and one diode connected in parallel with the transistor" is referred to as a "1-in-1 semiconductor device". A semiconductor device which incorporates N sets (N is 2 or more), each set of the N sets including "one transistor and one diode connected in parallel with the transistor", wherein at least two of the N transistors are connected in series, is referred to as an "N-in-1" semiconductor device. For instance, since the semiconductor device in Patent Literature 1 incorporates two transistors and two diodes connected in parallel with the transistors are incorporated (i.e., two sets of "one transistor and one diode connected in parallel with the transistor"), the two transistors being connected in series, is referred to as a 2-in-1 semiconductor device.

Examples of a power converter include a converter, an inverter, or one with both functions of the converter and the inverter. For instance, in a case of the converter, there may be a case where it is necessary to prepare two circuits in parallel for lower arm while one circuit is sufficient for upper arm. On the contrary, there may be a case where it is necessary to prepare two circuits in parallel for upper arm while one circuit is sufficient for lower arm. In addition, there may be a case where a 2-in-1 semiconductor device cannot be used due to having to connect to a reactor configuring a converter. Further, there may be a case where one unit is used as a power converter for driving different motors. Depending on for what the power converter is to be used, it can be preferable to stack different types of semiconductor devices (e.g., a 1-in-1 semiconductor device and a 2-in-1 semiconductor device), not to stack only the same type of semiconductor devices (e.g., 2-in-1 semiconductor devices).

In a power converter, each of an upper arm circuit and a lower arm circuit is turned on or off at particular cycles, thereby boosting or reducing a voltage. When each of the upper arm circuit and the lower arm circuit is turned on or off, a surge can occur in a semiconductor device configuring the circuits. In particular, in a power converter in which each of the upper arm circuit and the lower arm circuit is switched on or off at high frequency, the surge problem becomes significant for a 1-in-1 semiconductor device because the 1 in 1 semiconductor device has a larger number of input and output terminals than a number of input and output terminals an N-in-1 semiconductor device has. Therefore, for a power converter which incorporates both a 1-in-1 semiconductor device and an N-in-1 semiconductor device, it is necessary to prevent the surge in the 1-in-1 semiconductor device from occurring. Herein, provided is a technique for preventing the surge in a 1-in-1 semiconductor device from occurring in a power converter which includes both the 1-in-1 semiconductor device and an N-in-1 semiconductor device.

A power converter disclosed herein uses an electric current flowing in a high potential side terminal connected to an upper arm circuit and an electric current flowing in a low potential side terminal connected to a lower arm circuit, to prevent a surge voltage from being generated. Specifically, a wiring connected to the high potential side terminal is disposed parallel to a wiring connected to the low potential side terminal, and electric currents flowing in both wirings are made opposite to each other, so that magnetic fields generated by the current supply cancel each other out, thereby preventing mutual inductance from occurring. By preventing the mutual inductance from occurring, a surge is prevented from occurring in the semiconductor device as a result. Notably, in a power converter having an upper arm circuit and a lower arm circuit, theoretically, electric currents do not flow in the upper arm circuit and the lower arm circuit at the same time. However, when the upper arm circuit (or the lower arm circuit) is switched from on state to off state, there is a period during which the electric currents transiently flow both in the upper arm circuit and the lower arm circuit at the same time. The power converter disclosed herein uses the period during which the electric currents transiently flow both in the upper arm circuit and the lower arm circuit at the same time, thereby preventing mutual inductance from occurring, and then preventing a surge from occurring.

A power converter disclosed herein comprises a plurality of semiconductor devices, and a plurality of cooling plates. The plurality of semiconductor devices are stacked alternately with the plurality of cooling plates, each of the semiconductor devices being in close contact with the corresponding adjacent cooling plate. The plurality of semiconductor devices includes at least two first sealed semiconductor devices, and a second sealed semiconductor device. Each of the first sealed semiconductor devices comprises a first semiconductor structure, and the first semiconductor structure includes a first transistor and a first diode connected in parallel with the first transistor. The first semiconductor structure is sealed with first resin. The second sealed semiconductor device comprises a plurality of second semiconductor structures. Each of the second semiconductor structures includes a second transistor and a second diode connected in parallel with the second transistor. At least two of the second transistors included in the plurality of second semiconductor structures are connected in series. Each of the second semiconductor structures is sealed with second resin. Each of the first sealed semiconductor devices includes a high potential side terminal connected to a cathode of the first diode of the first sealed semiconductor device, a portion of the high potential side terminal being outside of the first resin, and a low potential side terminal connected to an anode of the first diode of the first sealed semiconductor device, a portion of the low potential side terminal being outside of the first resin. In the power converter disclosed herein, the first low potential side terminal of the first-first sealed semiconductor device is connected with the second high potential side terminal of the second-first sealed semiconductor device. When viewed along a stacking direction of the plurality of the semiconductor devices and the plurality of the cooling plates, the portion of the first high potential side terminal of the first-first sealed semiconductor device that is outside of the first resin is disposed to overlap with the portion of the second low potential side terminal of the second-first sealed semiconductor device that is outside of the first resin. Each semiconductor device herein is a component in which one or a plurality of semiconductor elements (semiconductor chips) are sealed with the resin. Each of the first sealed semiconductor devices is a 1-in-1 semiconductor device, and the second sealed semiconductor device is an N-in-1 semiconductor device.

In the above-mentioned power converter, the first high potential side terminal overlaps with the second low potential side terminal in the stacking direction. In such a configuration, when viewed along the stacking direction, a position where a wiring on a high potential side is connected to the first high potential side terminal can be matched with a position where a wiring on a low potential side is connected to the second low potential side terminal. Specifically, this will be described with reference to a power converter illustrated in FIG. 13. FIG. 13 illustrates a schematic diagram of semiconductor devices 24a and 24b seen in a plan view. Each of the semiconductor devices 24a and 24b is a 1-in-1 semiconductor device. As illustrated in FIG. 13, the semiconductor device 24a configuring an upper arm circuit, a cooling plate 6b, and the semiconductor device 24b configuring a lower arm circuit are stacked. The semiconductor device 24a includes a first high potential side terminal HT1, and a first low potential side terminal LT1. The semiconductor device 24b includes a second high potential side terminal HT2, and a second low potential side terminal LT2. The first high potential side terminal HT1 and the first low potential side terminal LT1 extend from a body portion of the semiconductor device 24a (a portion sealed with resin) along a direction 102 different from a stacking direction 101 to an outside. Likewise, the second high potential side terminal HT2 and the second low potential side terminal LT2 extend from a body portion of the semiconductor device 24b along the direction 102 to the outside. A wiring L1 extending along a direction 103 different from the directions 101 and 102 is connected to the first high potential side terminal HT1. A wiring L2 extending along the direction 103 is connected to the second low potential side terminal LT2. The first low potential side terminal LT1 is connected to the second high potential side terminal HT2 by a wiring L3.

In the above power converter, when viewed along the stacking direction 101, a position of the first high potential side terminal HT1 in the direction 103 is matched with a position of the second low potential side terminal LT2 in the direction 103. As a result, in the direction 103, a position where the wiring L1 is connected to the first high potential side terminal HT1 is matched with a position where the wiring L2 is connected to the second low potential side terminal LT2. When a transistor of the semiconductor device 24a (or a transistor of the semiconductor device 24b) is switched from on state to off state, opposite-direction currents transiently flow in the wirings L1 and L2, so that magnetic fields generated by the current supply cancel each other out. As a result, mutual inductance can be reduced, so that surge voltages can be prevented from being generated in the semiconductor devices 24a and 24b.

As illustrated in FIG. 14, when an upper arm circuit and a lower arm circuit are sealed in a semiconductor device 624, a position of a high potential side terminal HT1 connected to the upper arm circuit is not matched with a position of a low potential side terminal LT connected to the lower arm circuit in the direction 103 of the semiconductor device. In this case, when wirings L1 and L2 are drawn out along the direction 103 like FIG. 13, a non-opposed portion 603 in which the wiring L1 is not opposed to the wiring L2 is provided. Even when opposite-position currents flow in the wirings L1 and L2, magnetic fields cannot cancel each other out in the non-opposed portion 603.

DESCRIPTION OF EMBODIMENTS

First Embodiment

Figure 1:
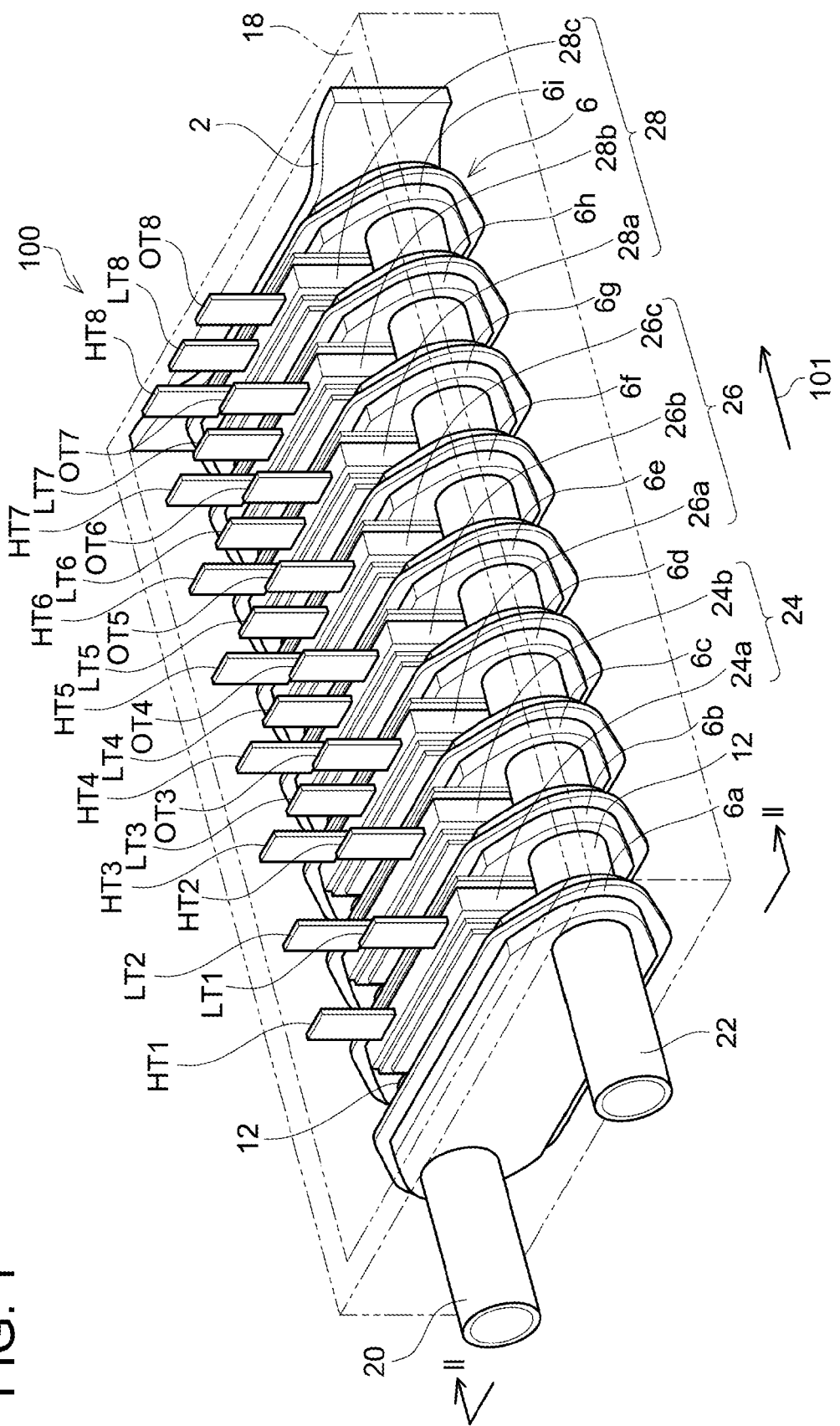
FIG. 1 illustrates a perspective view of a power converter of a first embodiment.
Figure 2:
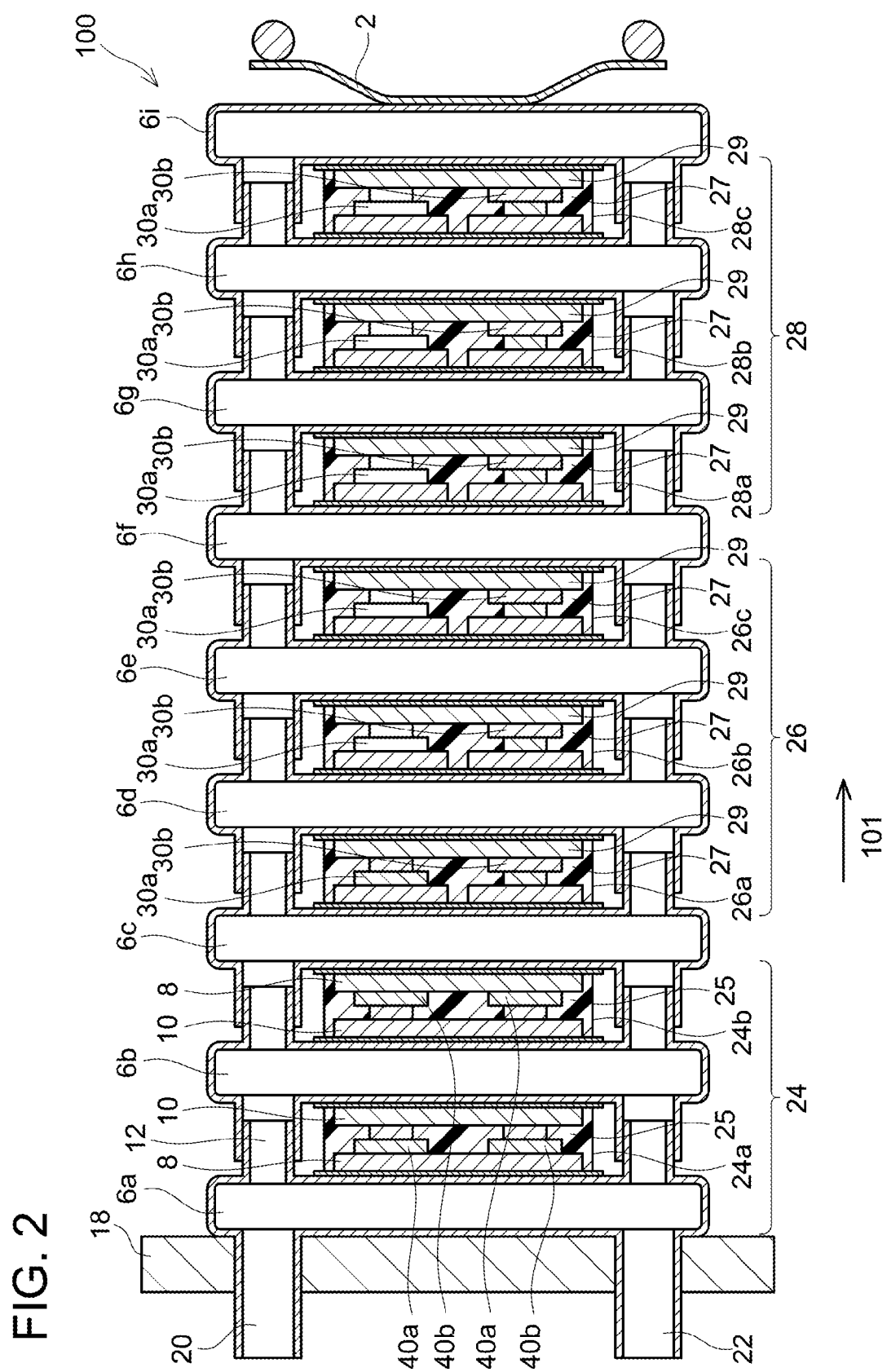
FIG. 2 illustrates a cross-sectional view taken along line II-II in FIG. 1.
Figure 3:
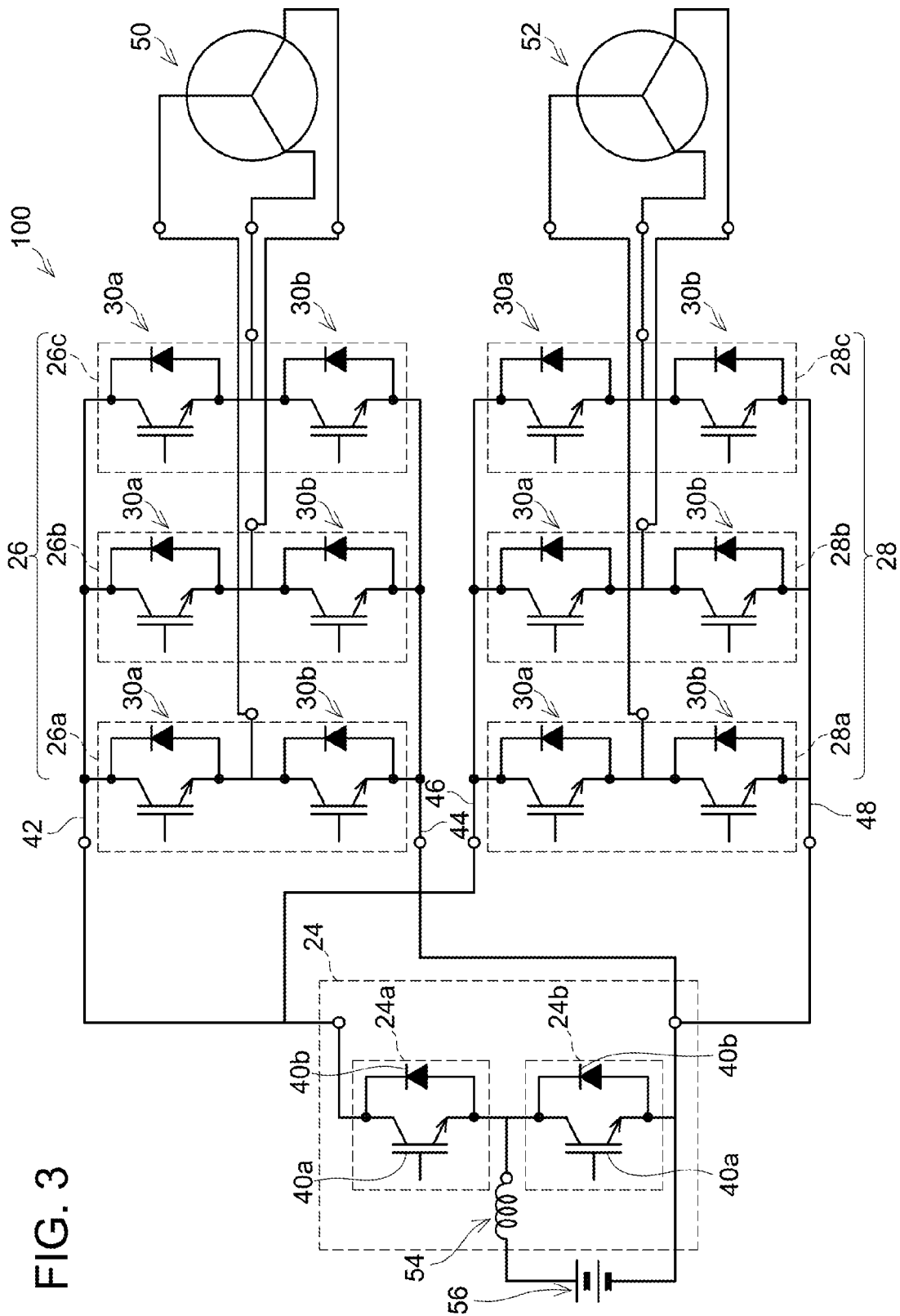
FIG. 3 illustrates a circuit diagram of a system using the power converter of the first embodiment.

Referring to FIGS. 1 to 3, a power converter 100 will be described. In FIG. 1, a housing 18 of the power converter 100 is indicated by imaginary lines, and in FIG. 2, only a portion of the housing 18 is illustrated. In the following descriptions, alphabets in reference numerals of components may be omitted when the components have a substantially same function.

As illustrated in FIGS. 1 and 2, the power converter 100 has a voltage converter circuit 24, a first inverter circuit 26, and a second inverter circuit 28. As illustrated in FIG. 3, the power converter 100 is used for driving two motors 50 and 52. The motors 50 and 52 are used for driving an electric vehicle, for instance. Specifically, the power converter 100 includes the voltage converter circuit 24 which is a chopper type and boosts a voltage of a power supply 56, the first inverter circuit 26 which converts a direct current power after the boosting to an alternate current power, and the second inverter circuit 28 which converts a direct current power after the boosting to an alternate current power. By the alternate current powers converted via the power converter 100, the motors 50 and 52 are driven. The power converter 100 can reduce voltages of regenerative powers from the motors 50 and 52 to store the resultant regenerative powers in the power supply 56. In this case, the voltage converter circuit 24 operates as a voltage reduction circuit. That is, the regenerative power (alternate current power) from the motors 50 and 52 are converted to direct current power by the inverter circuits 26 and 28, are then reduced in voltage by the voltage converter circuit 24, and are stored in the power supply 56.

As illustrated in FIGS. 1 and 2, the power converter 100 comprises eight semiconductor devices (power cards) 24a, 24b, 26a, 26b, 26c, 28a, 28b, and 28c, and a cooler 6. The cooler 6 includes nine cooling plates 6a to 6i. Interiors of the cooling plates 6a to 6i are hollow. The cooling plates 6a to 6i are connected by connection pipes 12. Coolant can be moved in the interiors of the cooling plates 6a to 6i. A coolant supply pipe 20 and a coolant discharge pipe 22 penetrate through the housing 18, and are connected to the cooler 6 (the cooling plate 6a). In the power converter 100, the semiconductor devices 24a, 24b, 26a, 26b, 26c, 28a, 28b, and 28c are stacked alternately with the cooling plates 6a to 6i in a manner where each of the semiconductor devices and each of the cooling plates alternately appear. That is, one semiconductor device is interposed between two cooling plates, the semiconductor device being in close contact with the corresponding adjacent cooling plate. The semiconductor devices 24a and 24b are an example of a first sealed semiconductor device, the semiconductor devices 26a, 26b, 26c, 28a, 28b, and 28c are an example of a second sealed semiconductor device, and the detail thereof will be described later.

The coolant supplied from the coolant supply pipe 20 is distributed through the connection pipes 12 into all the cooling plates 6a to 6i. The coolant, which passes through the interiors of the cooling plates 6a to 6i, absorbs heat in the semiconductor devices 24a, 24b, 26a, 26b, 26c, 28a, 28b, and 28c, and is discharged from the coolant discharge pipe 22. The coolant is liquid, such as water or LLC (Long Life Coolant). The cooling plates 6a to 6i and the semiconductor devices 24a, 24b, 26a, 26b, 26c, 28a, 28b, and 28c are pressed onto the housing 18 by a plate spring 2. Each of the semiconductor devices 24a, 24b, 26a, 26b, 26c, 28a, 28b, and 28c is in close contact with the corresponding adjacent cooling plate, and is cooled efficiently.

As illustrated in FIG. 3, the voltage converter circuit 24 includes the semiconductor devices 24a and 24b, and a reactor 54. In the semiconductor device 24a, one IGBT (Insulated Gate Bipolar Transistor) 40a and one reflux diode 40b are connected in parallel. Also in the semiconductor device 24b, one IGBT 40a and one reflux diode 40b are connected in parallel. The semiconductor devices 24a and 24b have substantially the same structure. The IGBT 40a is an example of a first transistor, and the reflux diode 40b is an example of a first diode.

As illustrated in FIG. 2, the IGBT 40a and the reflux diode 40b are in different semiconductor chips, and are connected to each other by metal plates 8 and 10. Specifically, an emitter of the IGBT 40a is connected to an anode of the reflux diode 40b by the metal plate 10, and a collector of the IGBT 40a is connected to a cathode of the reflux diode 40b by the metal plate 8. The semiconductor device 24a has a high potential side terminal HT1, and a low potential side terminal LT1. The high potential side terminal HT1 is connected to the metal plate 8. The low potential side terminal LT1 is connected to the metal plate 10 (also see FIG. 1). The semiconductor device 24b has a high potential side terminal HT2, and a low potential side terminal LT2. The high potential side terminal HT2 is connected to the metal plate 8. The low potential side terminal LT2 is connected to the metal plate 10. The high potential side terminal HT1 is an example of a first high potential side terminal, and the low potential side terminal LT1 is an example of a first low potential side terminal. The high potential side terminal HT2 is an example of a second high potential side terminal, and the low potential side terminal LT2 is an example of a second low potential side terminal. The IGBT 40a, the reflux diode 40b, and the metal plates 8 and 10 are sealed with resin 25. The semiconductor devices 24a and 24b are connected in series (see FIG. 3). That is, the two IGBTs 40a are connected in series. The semiconductor device 24a is an example of a first-first sealed semiconductor device, and the semiconductor device 24b is an example of a second-first sealed semiconductor device. The resin 25 is an example of first resin.

The "high potential" and the "low potential" herein refer to a high and low relation (i.e., which side of an IGBT is higher or lower in potential) in a case where an electric current flows in the IGBT 40a. That is, a collector side is at the high potential, and an emitter side is at the low potential. The high and low relation in a case where a forward current flows in the diode 40b is opposite to that of the IGBT. When the forward current flows in the diode 40b, an anode side (emitter side) is at the high potential, and a cathode side (collector side) is at the low potential. The "high potential" and the "low potential" herein refer to the high and low relation in the case where an electric current flows in the IGBT 40a, not in the diode 40b.

As illustrated in FIG. 3, the high potential side terminal of the semiconductor device 24a is connected to a wiring on the high potential side. The low potential side terminal of the semiconductor device 24b is connected to a wiring on the low potential side. Specifically, wiring L1 on the high potential side is connected to the high potential side terminal HT1 illustrated in FIG. 1, and wiring L2 on the low potential side is connected to the low potential side terminal LT2 (also see FIG. 13). The semiconductor device 24a may be referred to as an upper arm circuit, and the semiconductor device 24b may be referred to as a lower arm circuit. One end of the reactor 54 is connected to a high potential side of the power source 56. The other end of the reactor 54 is connected to a conductor (L3 in FIG. 13) connecting the low potential side terminal of the semiconductor device 24a and the high potential side terminal of the semiconductor device 24b. That is, the other end of the reactor 54 is connected to a middle point between the semiconductor devices 24a and 24b. It should be noted that an semiconductor device in which either of an upper arm circuit or a lower arm circuit is only provided (the semiconductor device 24a with the upper arm circuit only or the semiconductor device 24b with the lower arm circuit) may be referred to as a 1-in-1 semiconductor device or a 1-in-1 power card.

As illustrated in FIGS. 1 and 2, the semiconductor device 24a is disposed between the cooling plates 6a and 6b. The semiconductor device 24b is disposed between the cooling plates 6b and 6c. That is, the semiconductor devices 24a and 24b are stacked via the cooling plate 6b. A high potential side terminal HT1 and a low potential side terminal LT1 are provided in the first semiconductor device 24a, and a high potential side terminal HT2 and a low potential side terminal LT2 are provided in the second semiconductor device 24b. When viewed along a stacking direction 101, the high potential side terminal HT1 is disposed to overlap with the low potential side terminal LT2, and the low potential side terminal LT1 is disposed to overlap with the high potential side terminal HT2.

Each of the IGBT 40a and the reflux diode 40b is a vertical semiconductor element, and an electric current flows in a direction connecting the metal plates 8 and 10. The metal plate 10 of the semiconductor device 24a is disposed on the cooling plate 6b side, and the metal plate 10 of the semiconductor device 24b is disposed on a cooling plate 6b side. That is, the semiconductor devices 24a and 24b are disposed so that the emitters of the IGBTs 40a (the anodes of the reflux diodes 40b) are opposed to each other via the cooling plate 6b.

Referring to FIG. 3, the inverter circuits 26 and 28 will be described. The first inverter circuit 26 and the second inverter circuit 28 have substantially the same structure. Thus, the first inverter circuit 26 will be described, and the description of the second inverter circuit 28 may hereinafter be omitted.

The first inverter circuit 26 is a three-phase inverter, and supplies power to the motor 50, which is a three-phase alternate current motor. The first inverter circuit 26 has three semiconductor devices 26a, 26b, and 26c (also see FIGS. 1 and 2). Each of the semiconductor devices 26a, 26b, and 26c is connected between a high potential wiring 42 and a low potential wiring 44. The high potential wiring 42 is connected to the high potential side terminal HT1 of the semiconductor device 24a, and the low potential wiring 44 is connected to the low potential side terminal LT2 of the semiconductor device 24b (also see FIG. 1).

Each of the semiconductor devices 26a, 26b, and 26c has reverse conduction semiconductor elements 30a and 30b, which are connected in series (see FIGS. 2 and 3). Each of the reverse conduction semiconductor elements 30a and 30b is a vertical semiconductor element. The reverse conduction semiconductor elements 30a and 30b are sealed with resin 27. The semiconductor devices 26a, 26b, and 26c are an example of a second sealed semiconductor device. The reverse conduction semiconductor elements 30a and 30b are an example of a second semiconductor structure, and the resin 27 is an example of second resin.

The reverse conduction semiconductor element is a semiconductor element in which both of a transistor, such as an IGBT, and a reflux diode are incorporated in one semiconductor substrate. That is, each of the reverse conduction semiconductor elements 30a and 30b comprises a structure in which an IGBT and a reflux diode are connected in parallel in one semiconductor substrate. The reverse conduction semiconductor element 30a may be referred to as an upper arm circuit, and the reverse conduction semiconductor element 30b may be referred to as a lower arm circuit. The IGBTs included in the reverse conduction semiconductor elements 30a and 30b are connected in series. The IGBTs included in the reverse conduction semiconductor elements 30a and 30b are an example of a second transistor, and the reflux diodes included in the reverse conduction semiconductor elements 30a and 30b are an example of a second diode. It should be noted that a semiconductor device in which both an upper arm circuit and a lower arm circuit are sealed with resin (the semiconductor devices 26a, 26b, and 26c) may be referred to as a 2-in-1 semiconductor device or a 2-in-1 power card.

An IGBT turns on or off an electric current flowing from a collector to an emitter, and the electric current does not flow from the emitter to the collector. When an emitter side potential of the IGBT is higher than a collector side potential of the IGBT, the electric current flows from an anode of a diode connected to the emitter to a cathode of the diode connected to the collector. A state where an IGBT and a diode are connected in parallel so that current supply directions for the IGBT and diode are opposite is herein referred to as "reverse conduction".

In the first inverter circuit 26, the collector of the IGBT and the cathode of the diode included in each reverse conduction semiconductor element 30a are connected to the high potential wiring 42. In addition, the emitter of the IGBT and the anode of the diode included in each reverse conduction semiconductor element 30b are connected to the low potential wiring 44. That is, high potential side terminals HT3 to HT5 are connected to the high potential wiring 42, and low potential side terminals LT3 to LT5 are connected to the low potential wiring 44 (see FIGS. 1 and 3). The emitter of the IGBT and the anode of the diode included in each reverse conduction semiconductor element 30a are connected to a corresponding metal plate 29. Further, the collector of the IGBT and the cathode of the diode included in each reverse conduction semiconductor element 30b are connected to the corresponding metal plate 29 (see FIG. 2). That is, the reverse conduction semiconductor elements 30a and 30b are connected in series. Middle terminals OT3 to OT5 (see FIG. 1) are connected to the metal plate 29. Three-phase alternate current powers (in U-phase, V-phase, and W-phase) are output from middle points (middle terminals OT3 to OT5) between the reverse conduction semiconductor elements 30a and 30b.

In the second inverter circuit 28, each of the semiconductor devices 28a, 28b, and 28c is connected between a high potential wiring 46 and a low potential wiring 48. The high potential wiring 46 is connected to the high potential side terminal HT1 of the semiconductor device 24a, and the low potential wiring 48 is connected to the low potential side terminal LT2 of the semiconductor device 24b (also see FIG. 1). In the second inverter circuit 28, the collector of the IGBT and the cathode of the diode included in each reverse conduction semiconductor element 30a are connected to the high potential wiring 46. In addition, the emitter of the IGBT and the anode of the diode included in each reverse conduction semiconductor element 30b are connected to the low potential wiring 48. That is, high potential side terminals HT6 to HT8 are connected to the high potential wiring 46, and low potential side terminals LT6 to LT8 are connected to the low potential wiring 48 (see FIGS. 1 and 3). The emitter of the IGBT and the anode of the diode included in each reverse conduction semiconductor element 30a are connected to the corresponding metal plate 29. The collector of the IGBT and the cathode of the diode included in each reverse conduction semiconductor element 30b are connected to the corresponding metal plate 29 (see FIGS. 2 and 3). The reverse conduction semiconductor elements 30a and 30b are connected in series. Middle terminals OT6 to OT8 (see FIG. 1) are connected to the respective metal plates 29. Three-phase alternate currents (in U-phase, V-phase, and W-phase) are output from middle points (middle terminals OT6 to OT8) between the reverse conduction semiconductor elements 30a and 30b.

As illustrated in FIGS. 1 and 2, the semiconductor device 26a (the reverse conduction semiconductor elements 30a and 30b) is disposed between the cooling plates 6c and 6d. The semiconductor device 26b is disposed between the cooling plates 6d and 6e, and the semiconductor device 26c is disposed between the cooling plates 6e and 6f. The semiconductor devices 26b and 26c have substantially the same structure as that of the semiconductor device 26a. Thus, the details of the semiconductor devices 26b and 26c will not be described.

Figure 13:
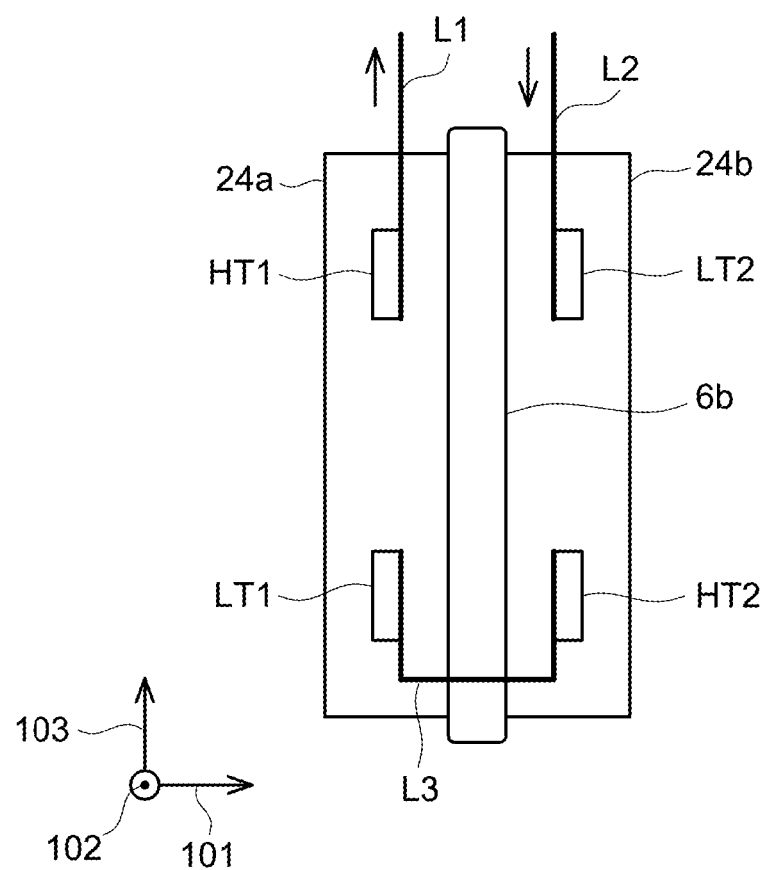
FIG. 13 illustrates a diagram of assistance in explaining a feature of the power converter of the first embodiment.
Figure 14:
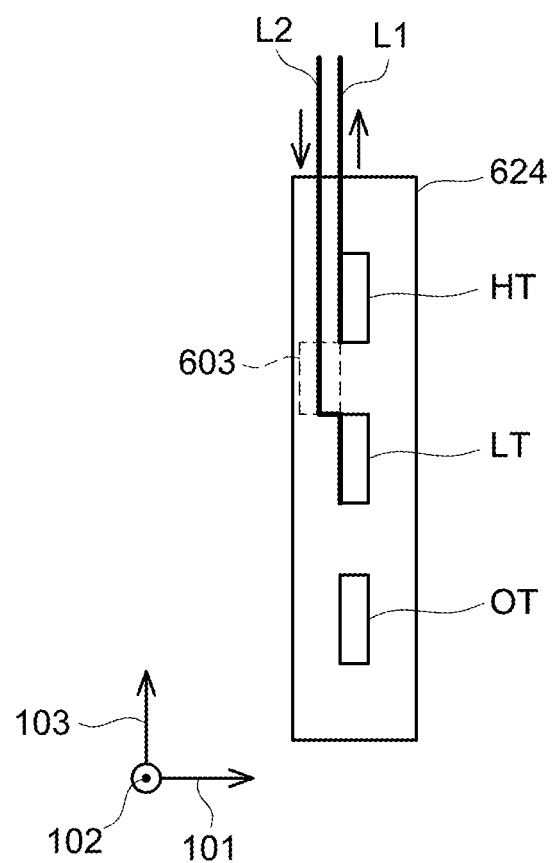
FIG. 14 illustrates a diagram for describing a feature of a 2-in-1 semiconductor device.

Advantages of the power converter 100 will be described below. Referring to FIGS. 13 and 14, a first advantage will be described. FIG. 13 illustrates a structure in which two 1-in-1 semiconductor devices are stacked, and is equivalent to a schematic diagram of the semiconductor devices 24a and 24b. FIG. 14 is equivalent to a schematic diagram of a 2-in-1 semiconductor device.

As illustrated in FIG. 13, the semiconductor device 24a configuring the upper arm circuit, the cooling plate 6b, and the semiconductor device 24b configuring the lower arm circuit are stacked. The semiconductor device 24a has the first high potential side terminal HT1, and the first low potential side terminal LT1. The semiconductor device 24b has a second high potential side terminal HT2, and a second low potential side terminal LT2. The first high potential side terminal HT1 and the first low potential side terminal LT1 extend from a body portion of the semiconductor device 24a (a portion sealed with the resin) along the direction 102 crossing the stacking direction 101 to the outside. Likewise, the second high potential side terminal HT2 and the second low potential side terminal LT2 extend from a body portion of the semiconductor device 24b along a direction 102 to the outside. The wiring L1 extending along an orthogonal direction 103 orthogonal to the directions 101 and 102 is connected to the first high potential side terminal HT1. The wiring L2 extending along the orthogonal direction 103 is connected to the second low potential side terminal LT2. The first low potential side terminal LT1 is connected to the second high potential side terminal HT2 by wiring L3.

As described above, in the power converter 100, when viewed along the stacking direction 101, a position of the high potential side terminal HT1 is matched with a position of the low potential side terminal LT2 (see FIG. 1). Thus, as illustrated in FIG. 13, in the direction 103, a position of the wiring L1 on the high potential side connected to the high potential side terminal HT1 is matched with a position of the wiring L2 on the low potential side connected to low potential side terminal LT2. The wirings L1 and L2 extend in parallel over their entire lengths. In the power converter 100, the transistor of the semiconductor device (the upper arm circuit) 24a or the transistor of the semiconductor device (the lower arm circuit) 24b is turned on, and a large surge voltage is then generated when opposite-direction currents transiently flow in the diodes. With the wirings L1 and L2 extending in parallel, when the transistor of the semiconductor device (the upper arm circuit) 24a or the transistor of the semiconductor device (the lower arm circuit) 24b is turned on and then opposite-direction currents transiently flow in the diodes, the opposite-direction currents flow in the wirings L1 and L2. When the opposite-direction currents flow in the wirings L1 and L2, magnetic fields generated by the currents can cancel each other out, thereby reducing inductance. The large surge voltage can be prevented from being generated in the power converter 100.

As illustrated in FIG. 14, for a 2-in-1 semiconductor device 624, in the direction 103, a position of a high potential side terminal HT connected to an upper arm circuit is not matched with a position of a low potential side terminal LT connected to a lower arm circuit. In this case, when the wirings L1 and L2 are drawn out along the direction 103 like in FIG. 13, a non-opposed portion 603 in which the wiring L1 is not opposed to the wiring L2 is provided. Even when opposite-direction currents flow in the wirings L1 and L2, magnetic fields cannot cancel each other out in the non-opposed portion 603. As a result, mutual inductance cannot be reduced, and a surge voltage cannot be prevented from being generated in a semiconductor device configuring the upper arm circuit and a semiconductor device configuring the lower arm circuit. To prevent a surge, it is advantageous to use the 1-in-1 semiconductor devices 24a and 24b that are 1-in-1 type. A reactance can be connected to a middle terminal OT of the 2-in-1 semiconductor device, thereby achieving a converter circuit. That is, a power converter can be formed only by a 2-in-1 semiconductor device. However, to prevent a surge voltage, it may be advantageous to use two 1-in-1 semiconductor devices in place of a 2-in-1 semiconductor device. The power converter in FIG. 1 is adjusted to have necessary characteristics by combining and stacking 1-in-1 semiconductor devices and 2-in-1 semiconductor devices.

Notably, an operation principle of the power converter 100, which has been known well, will not be described. Magnetic fields of the electric currents flowing in the wirings L1 and L2 do not always cancel each other out. However, when a large surge voltage is likely to be generated, this relationship can be obtained where the magnetic fields of the electric currents flowing in the wirings L1 and L2 can cancel each other out. The canceling-out of the magnetic fields is effective for reducing a surge voltage.

As described above, in the power converter 100, for the voltage converter circuit 24, the 1-in-1 semiconductor devices 24a and 24b are adopted for the upper arm circuit and the lower arm circuit, respectively, so that a surge voltage can be prevented from being generated. In the inverter circuits 26 and 28, each of the 2-in-1 semiconductor devices 26a to 26c and 28a to 28c, which incorporates the upper arm circuit and the lower arm circuit, is adopted, so that an entire length of the power converter in the stacking direction can be shortened. Thus, 1-in-1 semiconductor devices are adopted for one part of the power converter 100, and 2-in-1 semiconductor devices are adopted for another part of the power converter 100, so that the power converter 100 can be optimized in structure and characteristics.

A second advantage will be described. As described above, in the power converter 100, in both of the semiconductor devices 24a and 24b, each of the metal plates 10 is disposed on the cooling plate 6b side. Thus, the semiconductor devices 24a and 24b are disposed so that the emitters of the IGBTs 40a are opposed to the anodes of the reflux diodes 40b via the cooling plate 6b. When the semiconductor device 24a or 24b is switched and transient currents then flow in both the semiconductor devices 24a and 24b, the currents flowing in both are in opposite directions to each other, so that electric fields can cancel each other out.

Figures 4A, 4B:
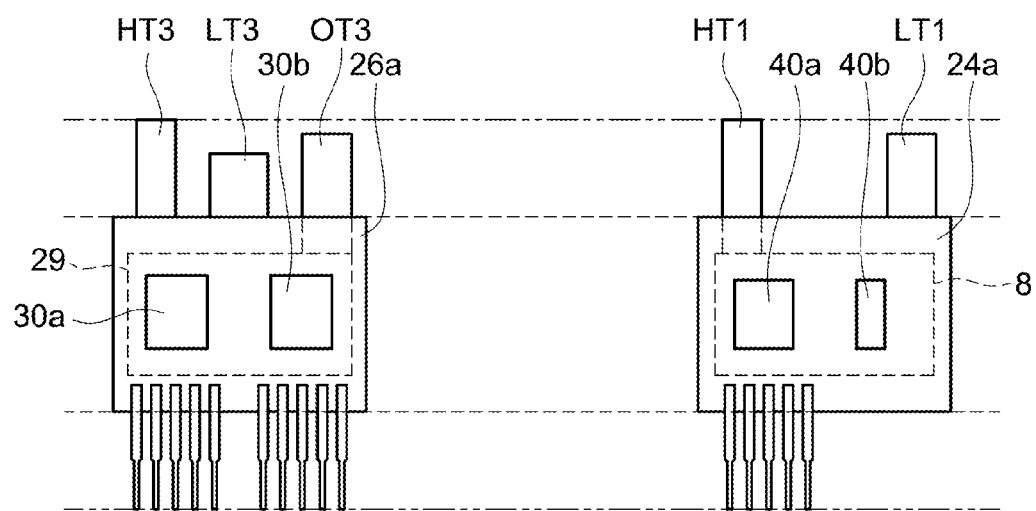
FIG. 4(a) illustrates a diagram for describing features of a 2-in-1 power card in the power converter of the first embodiment.
FIG. 4(b) illustrates a diagram for describing features of a 1-in-1 power card in the power converter of the first embodiment.

Referring to FIGS. 4(a) and 4(b), a third advantage will be described. FIGS. 4(a) and 4(b) illustrate inner structures of the semiconductor device 26a used in the first inverter circuit 26 and the semiconductor device 24a used in the voltage converter circuit 24, respectively (also see FIG. 1). As illustrated in FIG. 4(a), the semiconductor device 26a is a 2-in-1 power card, and has two semiconductor elements (semiconductor chips) 30a and 30b (the reverse conduction semiconductor elements 30a and 30b). As illustrated in FIG. 4(b), the semiconductor device 24a is the 1-in-1 power card, and has two semiconductor elements 40a and 40b (the IGBT 40a and the reflux diode 40b). The semiconductor devices 26a and 24a have different types of semiconductor elements, but have the same number of semiconductor elements. Due to this, the semiconductor devices 26a and 24a can have substantially the same size. The semiconductor devices of the first inverter circuit 26 and the voltage converter circuit 24 can be made to have substantially the same size, enabling these devices to be efficiently disposed in the cooler 6.

Like the semiconductor device 24a, by having the IGBT 40 and the reflux diode 40b as separate semiconductor elements, it is possible to form the IGBT 40a and the reflux diode 40b with different semiconductor materials. For instance, the semiconductor device 24a can be formed by the IGBT 40a made of silicon carbide and the reflux diode 40b made of silicon. At present, it is difficult to form a reverse conduction semiconductor element with silicon carbide. By forming the IGBT 40a and the reflux diode 40b to be separate, it is possible to form the IGBT 40a and the reflux diode 40b with silicon carbide that is excellent in a fast switching operation.

Second Embodiment

Figure 5:
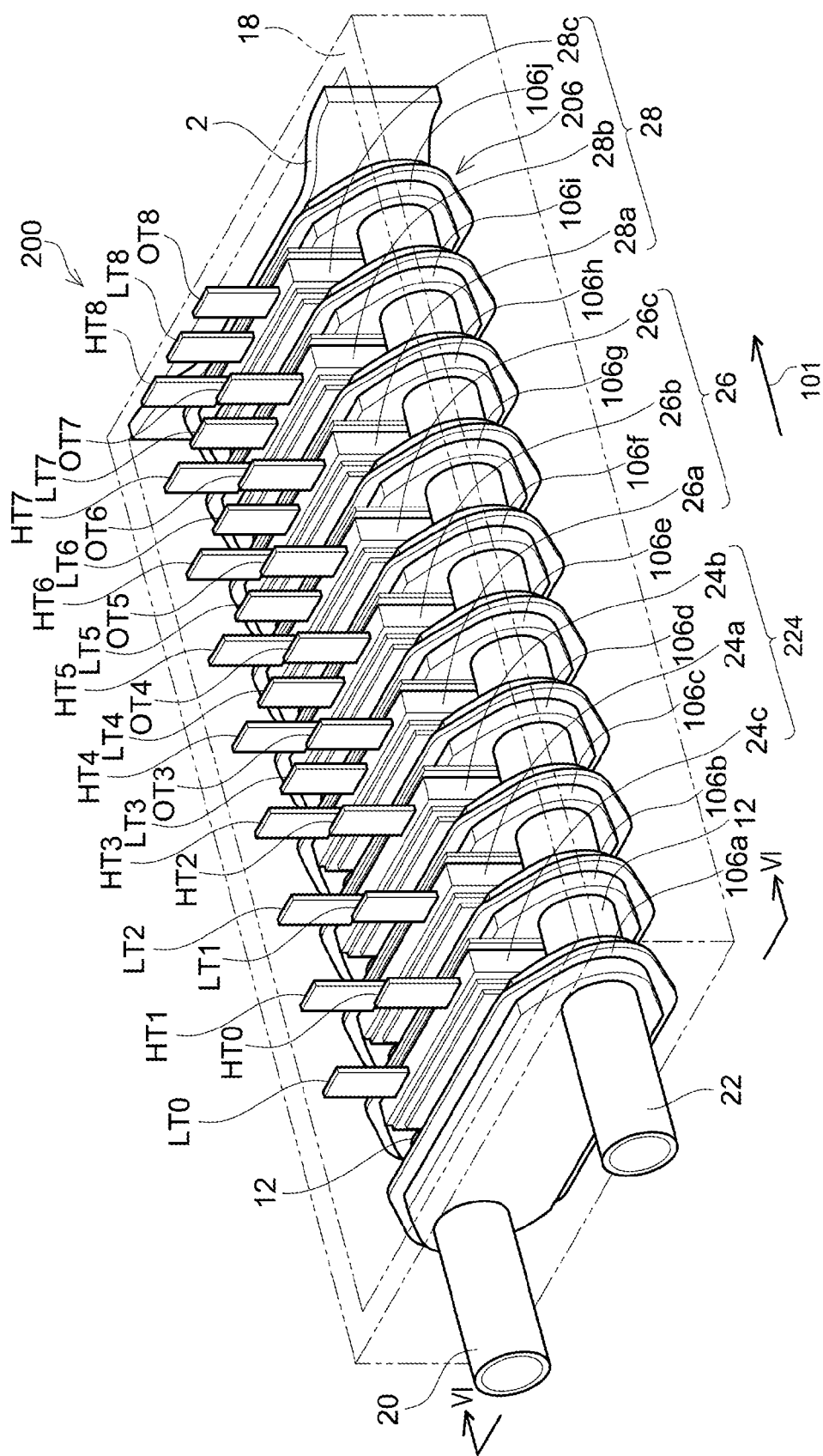
FIG. 5 illustrates a perspective view of a power converter of a second embodiment.
Figure 6:
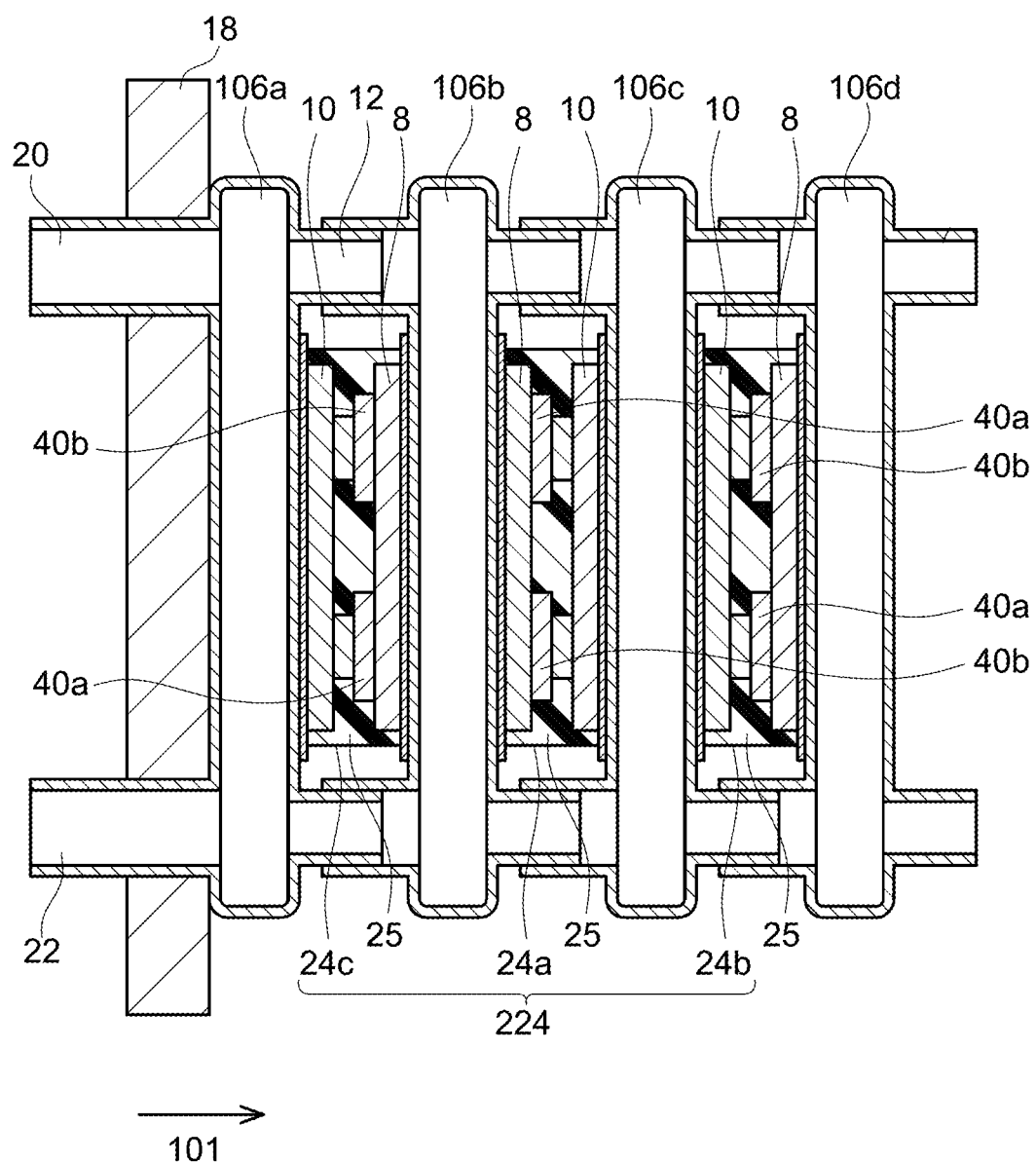
FIG. 6 illustrates a cross-sectional view taken along line VI-VI in FIG. 5.
Figure 7:
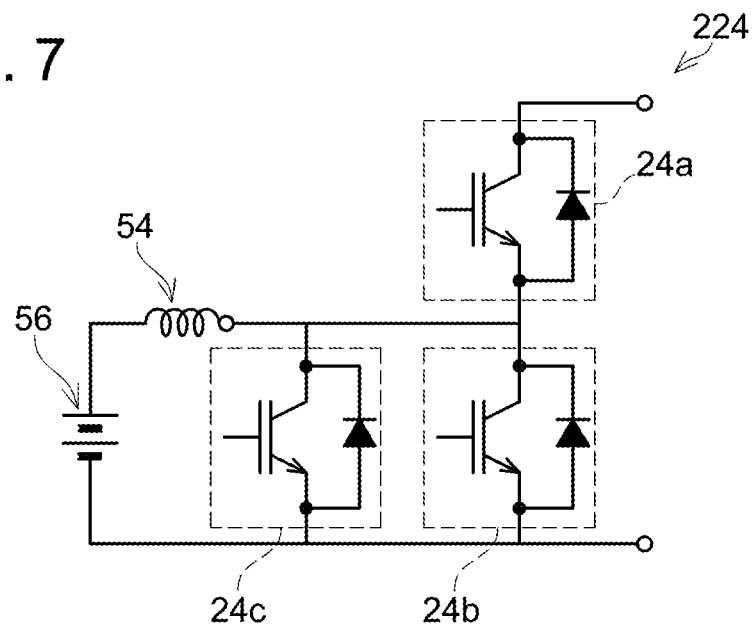
FIG. 7 illustrates a circuit diagram of a system using the power converter of the second embodiment.

Referring to FIGS. 5 to 7, a power converter 200 will be described. The power converter 200 is a modification of the power converter 100, and a voltage converter circuit 224 differs in structure from the voltage converter circuit 24 of the power converter 100. The first inverter circuit 26 and the second inverter circuit 28 have the same structure as those of the power converter 100. Thus, in FIGS. 6 and 7, only the voltage converter circuit 224 is illustrated, and the inverter circuits are omitted. The same components of the power converter 200 as those of the power converter 100 are indicated by the same reference numerals or reference numerals having identical last two digits, and the description thereof may hereinafter be omitted.

The voltage converter circuit 224 has semiconductor devices 24a and 24b, and a semiconductor device 24c. The semiconductor device 24c has substantially a same structure as those of the semiconductor devices 24a and 24b. As illustrated in FIGS. 5 and 6, the semiconductor device 24a is disposed between a cooling plate 106b and a cooling plate 106c. The semiconductor device 24b is disposed between the cooling plate 106c and a cooling plate 106d. The semiconductor device 24c is disposed between a cooling plate 106a and the cooling plate 106b.

As illustrated in FIG. 7, the voltage converter circuit 224 has one upper arm circuit (the semiconductor device 24a), and two lower arm circuits (the semiconductor devices 24b and 24c) connected in parallel. There may be a case where, according to how a voltage converter circuit is used, current capacities required for an upper arm circuit and a lower arm circuit are greatly different from each other. When a lower arm circuit is required to have a large current capacity, the voltage converter circuit 224 can ensure the large current capacity in the lower arm circuits because the voltage converter circuit 224 has a larger number of lower arm circuits than a number of those of the voltage converter circuit 24. The semiconductor device 24a is an example of a first-first sealed semiconductor device, the semiconductor device 24b is an example of a second-first sealed semiconductor device, and the semiconductor device 24c is an example of a third-first sealed semiconductor device.

As illustrated in FIGS. 5 and 6, in the voltage converter circuit 224, the semiconductor devices 24c, 24a, and 24b are stacked in this order in a stacking direction 101. That is, the lower arm circuit, the upper arm circuit, and the lower arm circuit are stacked in this order. Thus, in the stacking direction 101, a low potential side terminal LT0, a high potential side terminal HT1, and a low potential side terminal LT2 are disposed to overlap with each other in this order. In addition, in the stacking direction 101, a high potential side terminal HT0, a low potential side terminal LT1, and a high potential side terminal HT2 are disposed to overlap with each other in this order. The high potential side terminal HT0, low potential side terminal LT1, and high potential side terminal HT2 are connected to each other. When viewed along the stacking direction 101, positions of wirings connected to the low potential side terminal LT0, the high potential side terminal HT1, and the low potential side terminal LT2 are matched. Likewise, when viewed along the stacking direction 101, positions of wirings connected to the high potential side terminal HT0, the low potential side terminal LT1, and the high potential side terminal HT2 are matched. Like the power converter 100, in the power converter 200, when the semiconductor device 24a, 24b, or 24c is switched, opposite-direction currents flow in the adjacent wirings, so that magnetic fields due to the current supply can cancel each other out, and a large surge voltage can be prevented from being generated.

As illustrated in FIG. 6, in the voltage converter circuit 224, the metal plate 10 of the semiconductor device 24a and the metal plate 10 of the semiconductor device 24b are disposed on a cooling plate 106c side, and the metal plate 8 of the semiconductor device 24a and the metal plate 8 of the semiconductor device 24c are disposed on a cooling plate 106b side. That is, the semiconductor devices 24a and 24b are disposed so that emitters (anodes) are opposed to each other via the cooling plate 106c. The semiconductor devices 24a and 24c are disposed so that collectors (cathodes) are opposed to each other via the cooling plate 106c. When transient currents flow in both the semiconductor devices 24a and 24b, or when transient currents flow in both the semiconductor devices 24a and 24c, directions of the currents flowing in both are opposite, so that electric fields can cancel each other out.

In the voltage converter circuit 224, both an upper arm circuit and a lower arm circuit are not provided in each of the semiconductor devices 24a, 24b, and 24c. Thus, the number of semiconductor devices configuring lower arm circuits can only be increased without a need to increase the number of semiconductor devices configuring upper arm circuit. As compared with a case of increasing the number of lower arm circuits when using the semiconductor device in which both an upper arm circuit and a lower arm circuit are provided (for instance, the semiconductor devices 26a; see FIGS. 2 and 3), the semiconductor elements for upper arm circuit do not need to be prepared, and the cost can be lowered according thereto.

Third Embodiment

Figure 8:
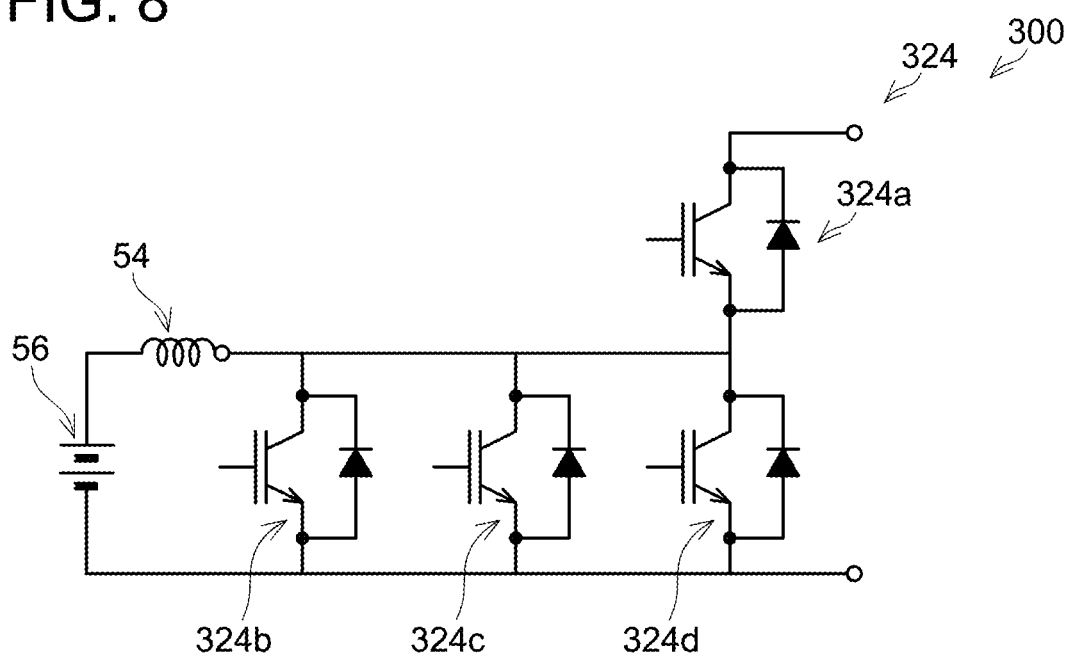
FIG. 8 illustrates a circuit diagram of a system using a power converter of a third embodiment.

Referring to FIG. 8, a power converter 300 will be described. The power converter 300 is a modification of the power converters 100 and 200, and a voltage converter circuit 324 differs in structure from the voltage converter circuit 24 of the power converter 100 and the voltage converter circuit 224 of the power converter 200. Inverter circuits in the power converter 300 have the same structure as those of the power converters 100 and 200. Thus, in FIG. 8, only the voltage converter circuit 324 is illustrated, and the inverter circuits are omitted. The same components of the power converter 300 as those of the power converters 100 and 200 are indicated by the same reference numerals or reference numerals having identical last two digits, and the description thereof may hereinafter be omitted. FIG. 8 illustrates only a circuit diagram of the voltage converter circuit 324.

As illustrated in FIG. 8, the voltage converter circuit 324 has one upper arm circuit 324a, and three lower arm circuits 324b, 324c, and 324d. In the voltage converter circuit 324, as compared with a case of using a semiconductor device in which an upper arm circuit and a lower arm circuit are provided, two semiconductor elements for the upper arm circuits can be omitted, and the cost can further be lowered.

By having an upper arm circuit and a lower arm circuit not provided in one semiconductor device, it is possible to have the number of upper arm circuits be larger than the number of lower arm circuits when current capacity required for upper arm circuit is larger than current capacity required for lower arm circuit. That is, the number of semiconductor devices configuring upper arm circuit can be increased without increasing the number of semiconductor devices configuring lower arm circuit.

Fourth Embodiment

Figure 9:
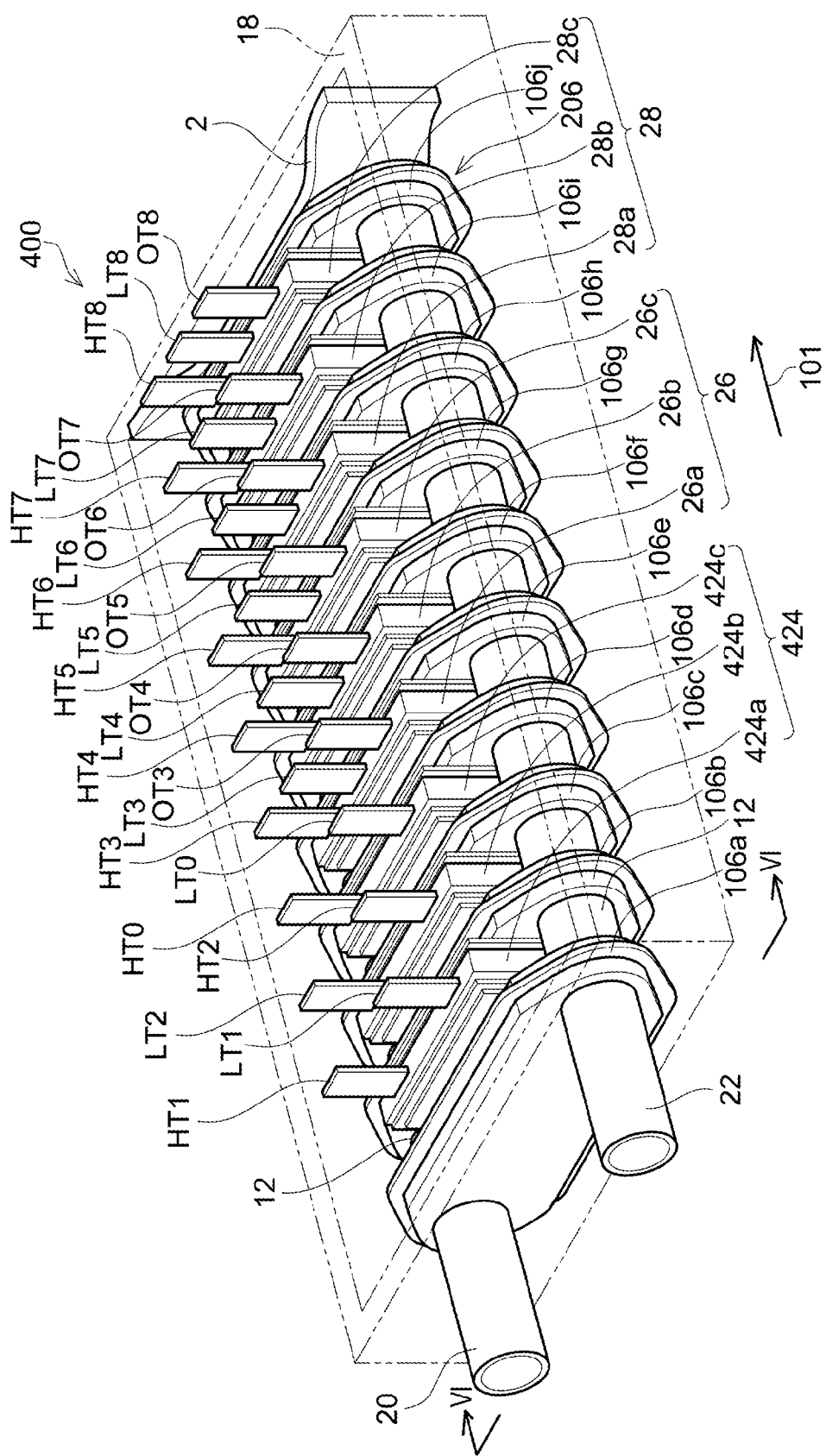
FIG. 9 illustrates a perspective view of a power converter of a fourth embodiment.
Figure 10:
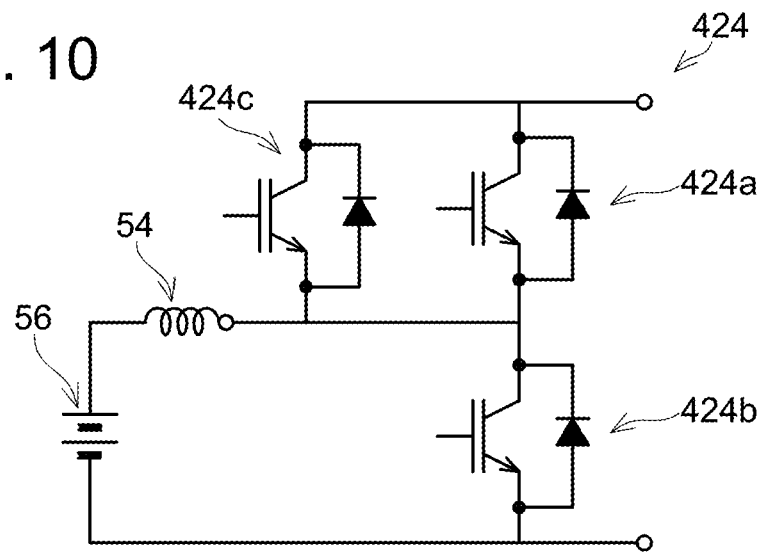
FIG. 10 illustrates a circuit diagram of a system using the power converter of the fourth embodiment.

Referring to FIGS. 9 and 10, a power converter 400 will be described. The power converter 400 is a modification of the power converters 100 and 200, and a voltage converter circuit 424 differs in structure from the voltage converter circuit 24 of the power converter 100 and the voltage converter circuit 224 of the power converter 200. A first inverter circuit 26 and a second inverter circuit 28 in the power converter 400 have the same structure as those of the power converters 100 and 200. Thus, in FIG. 10, only the voltage converter circuit 424 is illustrated, and the inverter circuits are omitted. The same components of the power converter 400 as those of the power converters 100 and 200 are indicated by the same reference numerals or reference numerals having identical last two digits, and the description thereof may hereinafter be omitted.

As illustrated in FIG. 10, the voltage converter circuit 424 has two upper arm circuits (semiconductor devices 424a and 424c) connected in parallel, and one lower arm circuit (a semiconductor device 424b). When the upper arm circuits are required to have large current capacity according to how a voltage converter circuit is to be used, the voltage converter circuit 424 can ensure the large current capacity in the upper arm circuits because the voltage converter circuit 424 has a larger number of upper arm circuits than a number of those of the voltage converter circuits 24 and 224. In this case, the semiconductor device 424a is an example of a first-first sealed semiconductor device, the semiconductor device 424b is an example of a second-first sealed semiconductor device, and the semiconductor device 424c is an example of a third-first sealed semiconductor device.

As illustrated in FIG. 9, in the voltage converter circuit 424, the semiconductor devices 424a, 424b, and 424c are stacked in this order along a stacking direction 101. That is, the upper arm circuit, the lower arm circuit, and the upper arm circuit are stacked in this order. In the stacking direction 101, a high potential side terminal HT1, a low potential side terminal LT2, and a high potential side terminal HT0 are disposed to overlap with each other in this order. In addition, in the stacking direction 101, a low potential side terminal LT1, a high potential side terminal HT2, and a low potential side terminal LT0 are disposed to overlap with each other in this order. The low potential side terminal LT1, the high potential side terminal HT2, and the low potential side terminal LT0 are connected to each other. When viewed along the stacking direction 101, positions of wirings connected to the high potential side terminal HT0, the low potential side terminal LT1, and the high potential side terminal HT2 are matched. Likewise, when viewed along the stacking direction 101, positions of wirings connected to the low potential side terminal LT0, the high potential side terminal HT1, and the low potential side terminal LT2 are matched. Like the power converters 100 and 200, in the power converter 400, when the semiconductor device 424a, 424b, or 424c is switched, opposite-direction currents flow in the adjacent wirings, so that magnetic fields due to current supply can cancel each other out, and a large surge voltage can be prevented from being generated.

Like the power converter 200, the semiconductor devices 424a and 424b may be disposed to be opposed (emitters or collectors are disposed to be opposed via the cooling plate) to each other, and the semiconductor devices 424a and 424c may be disposed to be opposed to each other. Thus, when transient currents flow in both the semiconductor devices 424a and 424b, or when transient currents flow in both the semiconductor devices 424a and 424c, directions of the currents flowing in both are opposite, so that electric fields can cancel each other out.

Fifth Embodiment

Figure 11:
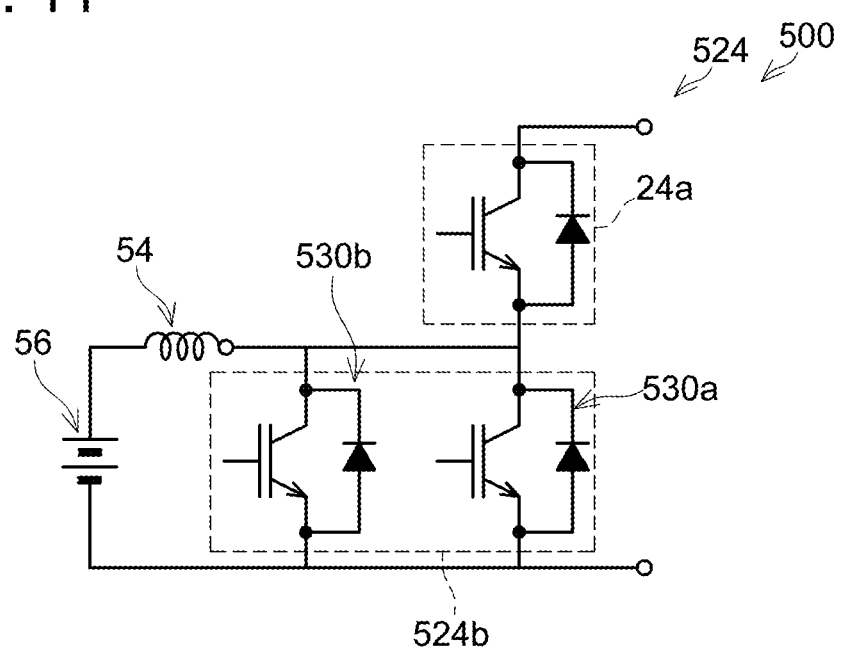
FIG. 11 illustrates a circuit diagram of a system using a power converter of a fifth embodiment.
Figure 12A:
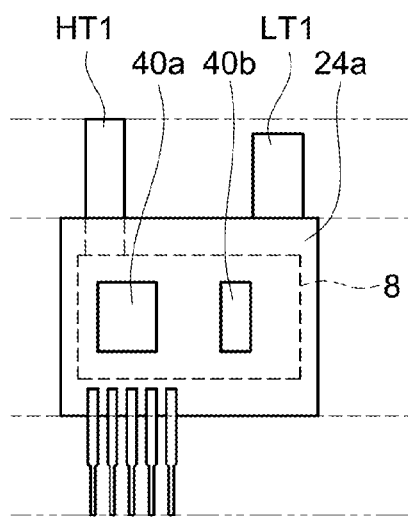
FIG. 12(a) illustrates a diagram for describing features of the two semiconductor elements in the power converter of the fifth embodiment.
Figure 12B:
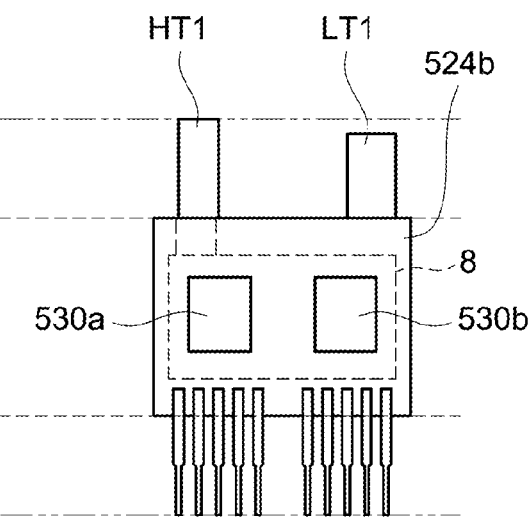
FIG. 12(b) illustrates a diagram for describing features of the two reverse conduction semiconductor elements in the power converter of the fifth embodiment.

Referring to FIGS. 11, 12(a), and 12(b), a power converter 500 is a modification of the power converter 200, and a voltage converter circuit 524 differs in structure from the voltage converter circuit of the power converter 200. Inverter circuits in the power converter 500 have the same structure as those of the power converter 200. Thus, in FIG. 11, only the voltage converter circuit 524 is illustrated, and the inverter circuits are omitted. The same components of the power converter 500 as those of the power converter 200 are indicated by the same reference numerals or reference numerals having identical last two digits, and the description thereof may hereinafter be omitted. FIG. 11 illustrates only a circuit diagram of the voltage converter circuit 524.

The voltage converter circuit 524 itself is the same as the voltage converter circuit 224 (see FIG. 7). However in the voltage converter circuit 224, each of the semiconductor devices 24a, 24b, and 24c configuring the voltage converter circuit 224 has one IGBT 40a, and one reflux diode 40b. Contrary to this, in the voltage converter circuit 524, one semiconductor device 524b has two reverse conduction semiconductor elements 530a and 530b. That is, the semiconductor device 524b has two IGBTs, and two reflux diodes. More specifically, one reverse conduction semiconductor element is sealed with the resin in each of the semiconductor devices 24a, 24b, and 24c, whereas two reverse conduction semiconductor elements are sealed with resin in the semiconductor device 524b. The reverse conduction semiconductor element 530a is an example of a reverse conduction semiconductor element (a first semiconductor structure) having a first transistor and a first diode connected in parallel with the first transistor. The reverse conduction semiconductor element 530b is an example of a reverse conduction semiconductor element (a third semiconductor structure) having a third transistor and a third diode connected in parallel with the third transistor.

The semiconductor device 524b is different from the semiconductor devices 26a to 26c configuring the inverter circuit 26 and the semiconductor devices 28a to 28c configuring the inverter circuit 28 (see FIG. 3). In each of the semiconductor devices 26a to 26c and 28a to 28c, the reverse conduction semiconductor elements 30a and 30b are connected in series. That is, each of the semiconductor devices 26a to 26c and 28a to 28c is a 2-in-1 semiconductor device in which an upper arm circuit and a lower arm circuit are provided. Contrary to this, in the semiconductor device 524b, the reverse conduction semiconductor elements 530a and 530b are connected in parallel. The semiconductor device 524b is a 1-in-1 semiconductor device in which a lower arm circuit only is provided. The voltage converter circuit 524, by using the semiconductor device 524b, can have a smaller number of semiconductor devices used in the voltage converter circuit than a number of those used in the voltage converter circuit 200.

FIGS. 12(a) and (b) illustrate inner structures of the semiconductor devices 24a and 524b (also see FIGS. 4(a) and 4(b)). As described above, the semiconductor device 24a illustrated in FIG. 12(a) has two semiconductor elements 40a and 40b (an IGBT 40a and a reflux diode 40b). The semiconductor device 524b illustrated in FIG. 12(b) has two reverse conduction semiconductor elements 530a and 530b. The semiconductor devices 24a and 524a have the same number of semiconductor elements, and accordingly can have substantially the same size. The semiconductor devices 24b and 524b configuring the voltage converter circuit 524 can have substantially the same size, and can be efficiently disposed in the cooler 6.

In this example, the reverse conduction semiconductor elements 530a and 530b configuring the lower arm circuits are incorporated in one semiconductor device 524b. However, the technique for incorporating two reverse conduction semiconductor elements into one semiconductor device is also applicable to two upper arm circuits in the voltage converter circuit 424 (also see FIG. 10), for instance. Alternatively, the technique for incorporating two reverse conduction semiconductor elements into one semiconductor device is applicable to two of three lower arm circuits in the voltage converter circuit 324.

In the above embodiment, a power converter in which a 1-in-1 semiconductor device and a 2-in-1 semiconductor device are combined and stacked has been described. However, the technique disclosed herein is also applicable to a power converter in which a 1-in-1 semiconductor device and an N (N being 2 or more) in 1 semiconductor device are combined and stacked. For instance, the technique disclosed herein is also applicable to a power converter in which a 1-in-1 semiconductor device and a semiconductor device (a 3-in-1 semiconductor device) which incorporates three sets of "one transistor and one diode connected in parallel with the transistor", two of the three transistors being connected in series, are combined and stacked.

Some of the technical features of the power converter disclosed herein will be described below. The following matters have technical usefulness independently.

The power converter comprises a plurality of cooling plates, and a plurality of semiconductor devices. The cooling plates and the semiconductor devices are stacked alternately. The cooling plates are hollow, and are connected by connection pipes. Coolant passes through interiors of the cooling plates. The plurality of semiconductor devices Rums a voltage converter circuit and an inverter circuit.

The power converter comprises a first sealed semiconductor device, a second sealed semiconductor device, and a cooler. There are at least two or more first sealed semiconductor devices. Each of the first sealed semiconductor devices has a first semiconductor structure including a first transistor and a first diode connected in parallel with the first transistor. The first semiconductor structure is sealed with first resin. A high potential side terminal is connected to a cathode of the first diode of the first sealed semiconductor device, at least a portion of the high potential side terminal being outside of the first resin. A low potential side terminal is connected to an anode of the first diode of the first sealed semiconductor device, at least a portion of the low potential side terminal being outside of the first resin. Each of the first transistor and the first diode may be a vertical semiconductor element. The first transistor and the first diode are separate semiconductor elements (semiconductor chips), and are sealed with the resin to form the first sealed semiconductor device.

Two first sealed semiconductor devices (a first-first sealed semiconductor device and a second-first sealed semiconductor device) may be stacked via one of the cooling plates. The first low potential side terminal of the first-first sealed semiconductor device is connected with the second high potential side terminal of the second-first sealed semiconductor device. When viewed along a stacking direction of the plurality of the semiconductor devices and the plurality of the cooling plates, the portion of the first high potential side terminal of the first-first sealed semiconductor device that is outside of the first resin is disposed to overlap with the portion of the second low potential side terminal of the second-first sealed semiconductor device that is outside of the first resin.

The second sealed semiconductor device comprises a plurality of second semiconductor structures, and each of the second semiconductor structures includes a second transistor and a second diode connected in parallel with the second transistor. Each of the plurality of second semiconductor structures is sealed with second resin. The second transistor and the second diode form a reverse conduction semiconductor element. The second transistor and the second diode may be incorporated in one semiconductor element. Each of the reverse conduction semiconductor elements may be a vertical semiconductor element. The reverse conduction semiconductor element may be an IGBT with a reflux diode. The first sealed semiconductor device and the second sealed semiconductor device are stacked via one of the cooling plates.

The power converter may comprise three or more first sealed semiconductor devices. For instance, the power converter may comprise the first-first sealed semiconductor device, the second-first sealed semiconductor device, and a third-first sealed semiconductor device. In this case, the first-first sealed semiconductor device and the third-first sealed semiconductor device may be stacked via one of the cooling plates. The first-first sealed semiconductor device may be an upper arm circuit, and each of the second-first sealed semiconductor device and the third-first sealed semiconductor device may be a lower arm circuit. In this case, the second-first sealed semiconductor device, the first-first sealed semiconductor device, and the third-first sealed semiconductor device may be stacked in this order via the cooling plates. Alternatively, each of the first-first sealed semiconductor device and the third-first sealed semiconductor device may be an upper arm circuit, and the second-first sealed semiconductor device may be a lower arm circuit. In this case, the first-first sealed semiconductor device, the second-first sealed semiconductor device, and the third-first sealed semiconductor device may be stacked in this order via the cooling plates.

The first transistor is formed of silicon carbide or silicon. The first diode is also formed of silicon carbide or silicon. In this case, the first transistor and the first diode may be formed by using different types of semiconductor substrates (for instance, the first transistor is formed of silicon carbide, and the first diode is formed of silicon).

The power converters of the embodiments each have a converter circuit and an inverter circuit. The converter circuit is formed by the plurality of first sealed semiconductor devices. When the converter circuit is formed by the first-first sealed semiconductor device and the second-first sealed semiconductor device, the first low potential side terminal provided in the first-first sealed semiconductor device is connected to the second high potential side terminal provided in the second-first sealed semiconductor device. When viewed along the stacking direction, the portion of the first low potential side terminal that is outside of the first resin may be disposed to overlap with the portion of the second high potential side terminal that is outside of the first resin. When viewed along the stacking direction, the portion of the first high potential side terminal provided in the first-first sealed semiconductor device that is outside of the first resin may be disposed to overlap with the portion of the second low potential side terminal provided in the second-first sealed semiconductor device that is outside of the first resin. The converter circuit further comprises a reactor which is connected between a power supply and a conductor connecting the first low potential side terminal and the second high potential side terminal. The inverter circuit is formed by a plurality of second sealed semiconductor devices. The inverter circuit is connected to the first high potential side terminal and the second low potential side terminal.

The converter circuit may comprise three or more first sealed semiconductor devices. There may be a case where in a converter circuit, the number of semiconductor devices configuring lower arm circuit is larger than the number of semiconductor devices configuring upper arm circuit. Alternatively, there may be a case where the number of semiconductor devices configuring upper arm circuit is larger than the number of semiconductor devices configuring lower arm circuit. In such a case, a converter circuit is sometimes formed by the first-first sealed semiconductor device, the second-first sealed semiconductor device, and the third-first sealed semiconductor device. When the number of semiconductor devices configuring lower arm circuit is larger than the number of semiconductor devices configuring upper arm circuit, the first-first sealed semiconductor device is connected to a wiring on the high potential side (i.e., forms an upper arm circuit), and the second-first sealed semiconductor device and the third-first sealed semiconductor device are connected to a wiring on the low potential side (i.e., forms lower arm circuits). In this case, in the stacking direction, the upper arm circuit may be disposed between the lower arm circuits. That is, in the stacking direction, the second-first sealed semiconductor device, a cooling plate, the first-first sealed semiconductor device, the cooling plate, and the third-first sealed semiconductor device may be stacked in this order. When viewed along the stacking direction, the first high potential side terminal of the first-first sealed semiconductor device, the second low potential side terminal of the second-first sealed semiconductor device, and a third low potential side terminal of the third-first sealed semiconductor device may be disposed to overlap with each other. When viewed along the stacking direction, the first low potential side terminal of the first-first sealed semiconductor device, the second high potential side terminal of the second-first sealed semiconductor device, and a third high potential side terminal of the third-first sealed semiconductor device may be disposed to overlap with each other. The first low potential side terminal, the second high potential side terminal, and the third high potential side terminal may be connected.

When the number of semiconductor devices configuring upper arm circuit is larger than the number of semiconductor devices configuring lower arm circuit, the first-first sealed semiconductor device and the third-first sealed semiconductor device may be connected to a wiring on the high potential side (i.e., forms upper arm circuits), and the second-first sealed semiconductor device may be connected to a wiring on the low potential side (i.e., form a lower arm circuit). In this case, in the stacking direction, the first-first sealed semiconductor device, a cooling plate, the second-first sealed semiconductor device, a cooling plate, and the third-first sealed semiconductor device may be stacked in this order. When viewed along the stacking direction, the first high potential side terminal of the first-first sealed semiconductor device, the second low potential side terminal of the second-first sealed semiconductor device, and the third high potential side terminal of the third-first sealed semiconductor device may be disposed to overlap with each other. When viewed along the stacking direction, the first low potential side terminal of the first-first sealed semiconductor device, the second high potential side terminal of the second-first sealed semiconductor device, and the third low potential side terminal of the third-first sealed semiconductor device may be disposed to overlap with each other. The first low potential side terminal, the second high potential side terminal, and the third low potential side terminal may be connected.

The first to third high potential side terminals and the first to third low potential side terminals may extend in a direction crossing the stacking direction. The first to third high potential side terminals and the first to third low potential side terminals may be connected to the wiring on the high potential side or the wiring on the low potential side of the power converter. The wiring on the high potential side and the wiring on the low potential side may extend in parallel toward an orthogonal direction orthogonal to the crossing direction and the stacking direction.

The inverter circuit is formed by the second sealed semiconductor devices. The inverter circuit may be connected to the first high potential side terminal and the second low potential side terminal. Each of the semiconductor devices configuring phases of the inverter circuit has a first vertical reverse conduction semiconductor element connected to the wiring on the high potential side, and a second vertical reverse conduction semiconductor element connected to the wiring on the low potential side. That is, the first reverse conduction semiconductor element and the second reverse conduction semiconductor element are connected in series between the first high potential side terminal and the second low potential side terminal. Both of the first reverse conduction semiconductor element and the second reverse conduction semiconductor element may be sealed with resin. The respective semiconductor devices configuring the phases of the inverter circuits are disposed between the corresponding cooling plates. That is, the first reverse conduction semiconductor element and the second reverse conduction semiconductor element are disposed between the cooling plates. The first reverse conduction semiconductor element and the second reverse conduction semiconductor element may be formed by using a silicon substrate.

Specific examples of the present disclosure are described above in detail, but these examples are merely illustrative and place no limitation on the scope of the claims. The technology described in the claims also encompasses various changes and modifications to the specific examples described above. The technical elements explained in the present disclosure or drawings provide technical utility either independently or through various combinations. The present disclosure is not limited to the combinations described at the time the claims are filed. Further, the purpose of the examples shown by the present disclosure or drawings is to satisfy multiple objectives simultaneously, and satisfying any one of those objectives gives technical utility to the present disclosure.

What is claimed is:

1. A power converter comprising:
a plurality of semiconductor devices; and
a plurality of cooling plates,
wherein
the plurality of semiconductor devices are stacked alternately with the plurality of cooling plates, each of the semiconductor devices being in close contact with the corresponding adjacent cooling plate,
the plurality of semiconductor devices includes a first-first sealed semiconductor device, a second-first sealed semiconductor device, and a second sealed semiconductor device,
each of the first-first sealed semiconductor device and the second-first sealed semiconductor device comprises a first semiconductor structure which is sealed with first resin, and the first semiconductor structure includes a first transistor and a first diode connected in parallel with the first transistor,
the first-first sealed semiconductor device includes:
a first high potential side terminal connected to a cathode of the first diode of the first-first sealed semiconductor device, a first portion of the first high potential side terminal being outside of the first resin; and
a first low potential side terminal connected to an anode of the first diode of the first-first sealed semiconductor device, a second portion of the first low potential side terminal being outside of the first resin,
the second-first sealed semiconductor device includes:
a second high potential side terminal connected to a cathode of the first diode of the second-first sealed semiconductor device, a third portion of the second high potential side terminal being outside of the first resin; and a second low potential side terminal connected to an anode of the first diode of the second-first sealed semiconductor device, a fourth portion of the second low potential side terminal being outside of the first resin,
the second sealed semiconductor device comprises a plurality of second semiconductor structures,
each of the second semiconductor structures is sealed with second resin and includes a second transistor and a second diode connected in parallel with the second transistor,
at least two of the second transistors included in the plurality of second semiconductor structures are connected in series,
the first low potential side terminal of the first-first sealed semiconductor device is connected with the second high potential side terminal of the second-first sealed semiconductor device, and
when viewed along a stacking direction of the plurality of semiconductor devices and the plurality of cooling plates, the first portion of the first high potential side terminal of the first-first sealed semiconductor device that is outside of the first resin is disposed to overlap with the fourth portion of the second low potential side terminal of the second-first sealed semiconductor device that is outside of the first resin.

2. The power converter according to claim 1, wherein the second transistor and the second diode included in each of the second semiconductor structures are incorporated in a semiconductor substrate.

3. The power converter according to claim 1, wherein when viewed along the stacking direction, the second portion of the first low potential side terminal that is outside of the first resin is disposed to overlap with the third portion of the second high potential side terminal that is outside of the first resin.

4. The power converter according to claim 1, further comprising a converter circuit and an inverter circuit,
wherein the converter circuit is formed by the first-first sealed semiconductor device, the second-first sealed semiconductor device, and a reactor which is connected between a power supply and a conductor connecting the first low potential side terminal and the second high potential side terminal,
the inverter circuit is formed by a plurality of second sealed semiconductor devices, and
one end of the second transistors connected in series is connected to the first high potential side terminal and the other end is connected to the second low potential side terminal in each of the second sealed semiconductor devices.

5. The power converter according to claim 4, further comprising a third-first sealed semiconductor device,
wherein the converter circuit is formed by the first-first sealed semiconductor device, the second-first sealed semiconductor device, the third-first sealed semiconductor device and the reactor, and
the third-first sealed semiconductor device comprises a first semiconductor structure which is sealed with first resin, and the first semiconductor structure of the third-first semiconductor device includes a first transistor and a first diode connected in parallel with the first transistor.

6. The power converter according to claim 5, wherein a third high potential side terminal of the third-first sealed semiconductor device is connected to the first low potential side terminal of the first-first sealed semiconductor device.

7. The power converter according to claim 6, wherein
the first-first sealed semiconductor device and the third-first sealed semiconductor device are stacked via one of the cooling plates, and
when viewed along the stacking direction, the first portion of the first high potential side terminal that is outside of the first resin is disposed to overlap with a portion of a third low potential side terminal that is outside of the first resin.

8. The power converter according to claim 5, wherein a third low potential side terminal of the third-first sealed semiconductor device is connected to the second high potential side terminal.

9. The power converter according to claim 8, wherein
the first-first sealed semiconductor device and the third-first sealed semiconductor device are stacked via one of the cooling plates, and
when viewed along the stacking direction, the first portion of the first high potential side terminal that is outside of the first resin is disposed to overlap with a portion of a third high potential side terminal of the third-first sealed semiconductor device that is outside of the first resin.

10. The power converter according to claim 1, wherein
a first semiconductor element in which the first semiconductor structure is incorporated and a second semiconductor element in which a third semiconductor structure is incorporated are sealed by the first resin,
the third semiconductor structure includes a third transistor and a third diode connected in parallel with the third transistor, and
the first transistor and the third transistor are connected in parallel.

* * * * *